(12) United States Patent
Schett et al.

(10) Patent No.: US 8,975,896 B2
(45) Date of Patent: Mar. 10, 2015

(54) CRYOGENIC PROBEHEAD COOLER IN A NUCLEAR MAGNETIC RESONANCE APPARATUS

(75) Inventors: Oskar Schett, Uster (CH); Daniel Guy Baumann, Faellanden (CH); Marc Schnell, Zurich (CH); Cengiz Cetrefli, Zurich (CH); Daniel Marek, Schwerzenbach (CH); Klemens Kessler, Oberneunforn (CH); Philippe Stauffenegger, Duebendorf (CH)

(73) Assignee: Bruker BioSpin AG, Faellanden (CH)

( * ) Notice: Subject to any disclaimer, the term of this patent is extended or adjusted under 35 U.S.C. 154(b) by 426 days.

(21) Appl. No.: 13/407,819

(22) Filed: Feb. 29, 2012

(65) Prior Publication Data

US 2012/0242335 A1    Sep. 27, 2012

(30) Foreign Application Priority Data

Mar. 22, 2011    (DE) .......................... 10 2011 005 888

(51) Int. Cl.
    *G01R 33/34*    (2006.01)
(52) U.S. Cl.
    CPC .................................. *G01R 33/3403* (2013.01)
    USPC ......................................................... 324/318
(58) Field of Classification Search
    CPC .................................................. G01R 33/3403
    USPC .................................................. 324/300–322
    See application file for complete search history.

(56) References Cited

U.S. PATENT DOCUMENTS

| | | | | |
|---|---|---|---|---|
| 4,535,291 A | * | 8/1985 | Lee et al. ....................... | 324/320 |
| 4,633,682 A | * | 1/1987 | Laskaris ........................ | 62/51.1 |
| 5,247,256 A | * | 9/1993 | Marek ........................... | 324/321 |
| 5,298,864 A | * | 3/1994 | Muller et al. .................. | 324/321 |
| 5,327,729 A | | 7/1994 | Yanai | |
| 5,814,992 A | * | 9/1998 | Busse-Grawitz et al. ..... | 324/318 |
| 5,966,944 A | | 10/1999 | Inoue | |

(Continued)

FOREIGN PATENT DOCUMENTS

| | | |
|---|---|---|
| AT | 405 322 | 7/1999 |
| DE | 196 25 748 | 1/1998 |
| JP | 2000-62852 | 2/2000 |

OTHER PUBLICATIONS

Mochimitsu Komori, "Development of a Liquid Nitrogen Pump Using Superconducting Bulk Motor", IEEE Transactions on Applied Superconductivity, vol. 14, No. 2, Jun. 2004, 1659 ff.

(Continued)

*Primary Examiner* — Dixomara Vargas
(74) *Attorney, Agent, or Firm* — Paul Vincent

(57) ABSTRACT

An NMR (nuclear magnetic resonance) apparatus has a magnet system disposed in a cryostat (1), the cryostat having at least one nitrogen tank (3b) for receiving liquid nitrogen (5b) and a room temperature bore (7) for receiving an NMR probehead (8), wherein part(s) of the probehead or the overall probehead can be cooled to cryogenic temperatures by supplying liquid nitrogen (5b) via a supply line (14). The nitrogen tank (3b) of the cryostat (1) is connected to the NMR probehead (8) by means of a supply line (14) in such a fashion that liquid nitrogen (5b) is removed from the nitrogen tank (3b) and guided to the NMR probehead (8). The overall apparatus is therefore more compact, the operating comfort of the apparatus is increased, and the costs for acquisition, operation and maintenance are considerably reduced compared to previous comparable devices.

16 Claims, 10 Drawing Sheets

(56) References Cited

U.S. PATENT DOCUMENTS

| | | | | |
|---|---|---|---|---|
| 5,986,453 | A * | 11/1999 | Anderson et al. | 324/300 |
| 6,054,855 | A * | 4/2000 | Anderson | 324/318 |
| 6,605,944 | B2 * | 8/2003 | Engelke | 324/318 |
| 6,727,699 | B2 * | 4/2004 | Kasten | 324/318 |
| 6,885,192 | B2 * | 4/2005 | Clarke et al. | 324/300 |
| 7,053,610 | B2 * | 5/2006 | Clarke et al. | 324/300 |
| 7,053,619 | B2 * | 5/2006 | Morita et al. | 324/318 |
| 7,116,102 | B2 * | 10/2006 | Clarke et al. | 324/300 |
| 7,141,977 | B2 * | 11/2006 | Wakuda et al. | 324/319 |
| 7,141,979 | B2 * | 11/2006 | Marek | 324/322 |
| 7,157,999 | B2 * | 1/2007 | Kasten | 335/216 |
| 7,183,769 | B2 * | 2/2007 | Kasten et al. | 324/318 |
| 7,187,169 | B2 * | 3/2007 | Clarke et al. | 324/307 |
| 7,187,175 | B2 * | 3/2007 | Wakuda et al. | 324/319 |
| 7,218,115 | B2 * | 5/2007 | Morita et al. | 324/322 |
| 7,222,490 | B2 | 5/2007 | Triebe | |
| 7,282,919 | B2 * | 10/2007 | Doty et al. | 324/321 |
| 7,292,035 | B2 * | 11/2007 | Habara et al. | 324/316 |
| 7,295,011 | B2 * | 11/2007 | Morita et al. | 324/322 |
| 7,309,987 | B2 * | 12/2007 | Lukens et al. | 324/315 |
| 7,336,077 | B2 * | 2/2008 | Wakuda et al. | 324/321 |
| 7,430,871 | B2 | 10/2008 | Strobel | |
| 7,430,872 | B2 | 10/2008 | Strobel | |
| 7,501,822 | B2 * | 3/2009 | Sacher et al. | 324/318 |
| 7,545,143 | B2 * | 6/2009 | Morita et al. | 324/318 |
| 7,639,007 | B2 * | 12/2009 | Hutton et al. | 324/307 |
| 7,719,160 | B2 * | 5/2010 | Koizumi et al. | 310/266 |
| 8,027,139 | B2 * | 9/2011 | Beier | 361/141 |
| 8,054,077 | B2 * | 11/2011 | Hsieh et al. | 324/307 |
| 8,575,932 | B2 * | 11/2013 | Prestegard | 324/309 |
| 8,676,282 | B2 * | 3/2014 | Jiang et al. | 505/163 |
| 2009/0224862 | A1 * | 9/2009 | Mikheev et al. | 335/216 |

OTHER PUBLICATIONS

Tomiyoshi Haruyama et al., "A miniature centrifugal pump for an automatic liquid nitrogen filling system", J. Phys. E:Sci, Instrum. 19 (1986).

* cited by examiner

CRYOGENIC PROBEHEAD COOLER IN A NUCLEAR MAGNETIC RESONANCE APPARATUS

This application claims Paris Convention priority of DE 10 2011 005 888.5 filed Mar. 22, 2011 the complete disclosure of which is hereby incorporated by reference.

BACKGROUND OF THE INVENTION

The invention concerns an NMR (nuclear magnetic resonance) apparatus comprising a magnet system that is arranged in a cryostat, the cryostat having at least one nitrogen tank for receiving liquid nitrogen, and a room temperature bore for receiving an NMR probehead with a transmitting and receiving system, wherein part(s) of the probehead or the overall probehead can be cooled to cryogenic temperatures by supplying liquid nitrogen via a supply line.

An NMR apparatus of this type, comprising a cryostat and a cooled NMR probehead is disclosed e.g. in U.S. Pat. No. 5,247,256 (document [1]).

FIG. 2 schematically shows the prior art described in [1].

A cryostat 1 contains an inner tank 3a with gaseous helium 4a and liquid helium 5a for cooling a superconducting magnet coil 2, as well as a further tank 3b with gaseous nitrogen 4b and liquid nitrogen 5b, and also an interposed cold shield 27. The nitrogen tank 3b and cold shield 27 are used for thermal shielding of the helium tank 3a in order to minimize thermal losses. The helium tank 3a and the nitrogen tank 3b are thermally insulated with respect to one another and also with respect to the surroundings by means of a vacuum chamber 13.

A room temperature bore 7 for receiving an NMR probehead 8 is disposed in the cryostat 1. A transmitting and receiving system, which generally consists of an RF part 9 and an optional preamplifier 10, is located inside the NMR probehead 8. The RF part 9 typically consists of components such as resonator coils, gradient coils and an RF network. The RF part 9 and the preamplifier 10 are coupled to respective heat exchangers 11, 12, which are connected to the supply line 14.

Liquid nitrogen is removed from an external nitrogen tank 18 for cooling the transmitting and receiving system 9, 10, is guided via the supply line 14, which is connected to the NMR probehead 8 via a separable connection 19, through the heat exchangers 11 and 12, and is subsequently discharged from the probehead 8 to the surroundings. The overall transmitting and receiving system 9, 10 may thereby be cooled to cryogenic temperatures. It is also possible to only cool parts of the transmitting and receiving system 9, 10 to cryogenic temperatures, e.g. by only cooling the RF network or only cooling the coil.

Separate refilling containers are normally used for refilling the nitrogen tank 3b in the cryostat 1 and the external tank 18.

In the simplest form, the liquid nitrogen for cooling the NMR probehead is supplied through an excess pressure in the gas compartment of the external nitrogen tank [2].

The use of pumps for supplying cryogenic fluids [3],[4] was also examined in the past. It is moreover possible to build up a pressure in the external tank by increasing its own pressure, which can be additionally supported by a heating device.

A cryo-coldhead may be provided in the cryostat for liquefying nitrogen or helium [5].

A cryo-coldhead may also be located in the external cryogen tank for producing liquid nitrogen [6].

The waste gas may be returned along the supply line either coaxially with respect to the supply line or through a separate return line [1].

A conventional system including external cryogen tank and supply lines between external tank and NMR probehead requires a relatively large amount of space. In particular, the external cryogen tank occupies valuable space outside of the magnetic field. But space is rare in the laboratories, the sizes of which become increasingly smaller. Both research institutes and industry demand systems that are more compact.

The external cryogen tank causes considerable initial acquisition costs in addition to the cryostat that is expensive per se, and subsequently causes continuous additional maintenance and operating costs. Both the external tank and the inner tank in the cryostat have to be refilled, maintained and supervised, and must have the same or at least comparable safety devices. Mutual adjustment of the filling cycles of both containers is also required. In most cases, the external tank and the nitrogen tank of the cryostat must be refilled at different times, which results in frequent interruptions of the measurement operation and a prolonged downtime of the system. Parallel filling of both tanks is only possible with two refilling containers, which causes additional costs and requires additional space in the laboratory.

Continuous operation is only possible at considerable expense, e.g. by providing a cryo-coldhead on the cryostat PLUS an additional cryo-coldhead on the external cryogen tank. For this reason, at least two additional cryo-cooling machines are required. Compressors and cooling devices are moreover also required.

In contrast thereto, it is the underlying purpose of the present invention to improve an NMR apparatus with a probehead that is cooled to cryogenic temperatures of the above-mentioned type with as simple as possible technical means in such a fashion that the overall apparatus is more compact and requires less space, the operating comfort of the apparatus is increased, and the costs for acquisition, operation and maintenance are clearly reduced compared to conventional comparable devices.

SUMMARY OF THE INVENTION

In accordance with the invention, this object is completely achieved in a surprisingly simple but very effective fashion in that the nitrogen tank of the cryostat is connected to the NMR probehead by means of the supply line in such a fashion that liquid nitrogen can be removed from the nitrogen tank of the cryostat and be guided to the NMR probehead.

The proposed inventive solution may seem to be disadvantageous at first glance, since one would initially assume that this would, roughly estimated, double the rate of removed liquid nitrogen from the nitrogen tank of the cryostat, which would correspondingly halve the up time until the next refilling action. This, however, is opposed by a surprisingly large number of partially very significant advantages, namely:

- The operating comfort is increased and operation requires little supervision, at the same time reducing the costs for maintenance, repair and operation by omitting the external cryogen tank and instead additionally utilizing the nitrogen tank of the cryostat for cooling the NMR probehead.
- Only one single nitrogen tank must be refilled, which increases the time period during which the apparatus is available for measurements.
- Due to omission of the external cryogen tank, the nitrogen evaporation rate of the overall NMR apparatus is reduced, which considerably reduces nitrogen consumption.

Due to the very compact construction, no additional space is required for the external cryogen tank, which is a great advantage mainly for laboratories with limited space.

The infrastructure including lifting and refilling devices, which are always present in an NMR apparatus due to the cryostat, can then also be utilized for cooling the NMR probehead. Each cryogen tank moreover requires means for monitoring and protecting the vacuum chamber and the liquid cryogen chamber, e.g. pressure relief valves and liquid level sensors. When the external tank is omitted in correspondence with the inventive proposal, these devices of the cryostat can virtually be utilized twice, namely once for monitoring and protecting the cryostat itself and also additionally for the cooling system of the probehead.

Omission of the external cryogen tank consequently also considerably reduces the costs for acquisition and maintenance, since the apparatus then has considerably fewer individual components. In particular, the expensive external nitrogen dewar can be omitted.

The described system can be retrofitted to previously installed systems without any problem and is compatible with all conventional cryostats having a liquid nitrogen tank.

In one particularly preferred embodiment of the invention, the supply line projects through a nitrogen evaporation tower into the nitrogen tank of the cryostat such that liquid nitrogen for cooling the NMR probehead can be removed through one of the nitrogen evaporation towers, which are always provided on the cryostat. This is probably the simplest fashion of removing nitrogen analogous to the removal from an external container, which does not require any modifications to the cryostat.

In further advantageous embodiments of the inventive NMR apparatus, the cryostat has a removal device by means of which liquid nitrogen can be removed through hydrostatic pressure in the nitrogen tank of the cryostat. Liquid nitrogen can be removed at any container pressure. The system may have an even more compact construction when the removal device is located on the lower side of the cryostat.

One particularly preferred embodiment of the invention is distinguished in that the supply of nitrogen into the supply line is effected in that the pressure in the gas compartment of the nitrogen tank is higher than the ambient pressure. Installation of an additional external gas supply is not required in this case. No movable parts for supplying nitrogen are required. The supply is effected in an extremely simple fashion with only little expense, since the pressure control can be realized in a technically simple and inexpensive fashion. Every laboratory has a pressure-gas connection. Nitrogen or compressed air (with a nitrogen separator) can be connected. This creates moreover a virtually maintenance-free supply system. The self-vaporization rate of the nitrogen tank in the cryostat can be used to build up the supply pressure.

In one class of advantageous embodiments, a device for supplying liquid nitrogen into the supply line is disposed inside the nitrogen tank of the cryostat, which allows optimum adjustment of the delivery volume which, in this case, can be dosed with great precision, e.g. through corresponding control of the pump speed.

Embodiments of the inventive NMR apparatus, which represent an alternative thereto, are characterized in that a device for supplying liquid nitrogen into the supply line through suction is connected to a gas outlet of the NMR probehead. This enables supercooling of the nitrogen, lower temperatures can be achieved and the signal-to-noise ratio can be improved. These embodiments moreover also enable optimum adjustment of the delivery volume, since, in turn, very fine dosing is possible, e.g. through pump speed control. These embodiments can be easily retrofitted to any conventional cryostat and any conventional NMR probehead without modifications on the probehead or cryostat being required.

A further reduction of the thermal losses in the supply line, improved utilization of the residual cold contained in the waste gas for shielding the liquid nitrogen in the supply line and a reduction of the LN2 consumption can be realized with embodiments of the inventive NMR apparatus, in which a waste gas line for transporting nitrogen leaving the NMR probehead is provided coaxially to the supply line.

Particularly advantageous embodiments of the invention are characterized in that the supply line and/or a waste gas line for transporting nitrogen that leaves the NMR probehead, has/have at least one separable connection, advantageously a coupling connection. This facilitates assembly and disassembly of the supply line and the handling of the probehead. The same supply line may be used for several probeheads, thereby reducing the costs when several probeheads are used. Moreover, simplified assembly and disassembly of the supply line on the cryostat, simpler handling of the supply line and easy retrofitting to previously installed systems are of substantial advantage. Modifications on the cryostat are not required in this case.

A pressure sensor is advantageously provided in a chamber that is connected to the nitrogen tank of the cryostat. In combination with pressure control, the supply pressure can be adjusted to the respective consumption and the container pressure can be kept constant when the ambient pressure varies. When the pressure sensor is disposed in the liquid on the container bottom, one can also determine the instantaneous liquid level.

In further embodiments of the invention, a liquid level sensor may alternatively or additionally be provided in the nitrogen tank of the cryostat. This enables direct monitoring of the liquid level in the nitrogen tank, refilling can be performed in due time, falling below an excessively low level is reliably prevented and consumption can be better monitored, since, in particular, irregularities can be detected more quickly.

In one particularly preferred embodiment, a cryo-cooling finger projects into a chamber that is connected to the nitrogen tank of the cryostat. A combination of the inventive device and a cryo-cooling finger enables continuous operation of cryostat and probehead. A cryo-cooling finger is used for generating a cold surface on which nitrogen gas can condense. Refilling of the nitrogen tank, which is otherwise always necessary and is extremely inconvenient, is no longer necessary.

One advantageous further development of this embodiment is characterized in that the chamber containing the cryo-cooling finger is connected to an external gas supply. The cryostat is permanently refilled due to condensation of the gas from the external gas supply, and complex return of the cold gas is not required.

One particularly preferred embodiment of the invention is characterized in that a waste gas line is provided for returning the nitrogen gas, which leaves the NMR probe head, into a chamber that is connected to the nitrogen tank of the cryostat. This provides a closed loop and a virtually loss-free cryostat as well as reduced energy requirements for liquefaction, since cold gas can be returned.

In one advantageous further development of this embodiment, a gas pump is provided for supplying the nitrogen gas, which leaves the NMR probehead, into the chamber that is connected to the nitrogen tank of the cryostat. The gas pump may be used at the same time, either for supply through suction, or the pump may generate an excess pressure in the gas compartment of the nitrogen tank to effect supply.

This can be further improved by arranging a heat exchanger around at least one section of the waste gas line. This enables cooling of the compressed gas, the inlet temperature to the cooling finger is lowered and less cooling energy is required for cooling to the condensation temperature.

In another advantageous variant, the lines of the inventive NMR apparatus, which transport the gaseous and/or liquid nitrogen, are at least partially vacuum-insulated, which minimizes the thermal losses. The nitrogen consumption is reduced or the returned gas is less heated, and the cooling power required for condensation is minimized.

DESCRIPTION OF THE PREFERRED EMBODIMENT

Figure 1A:
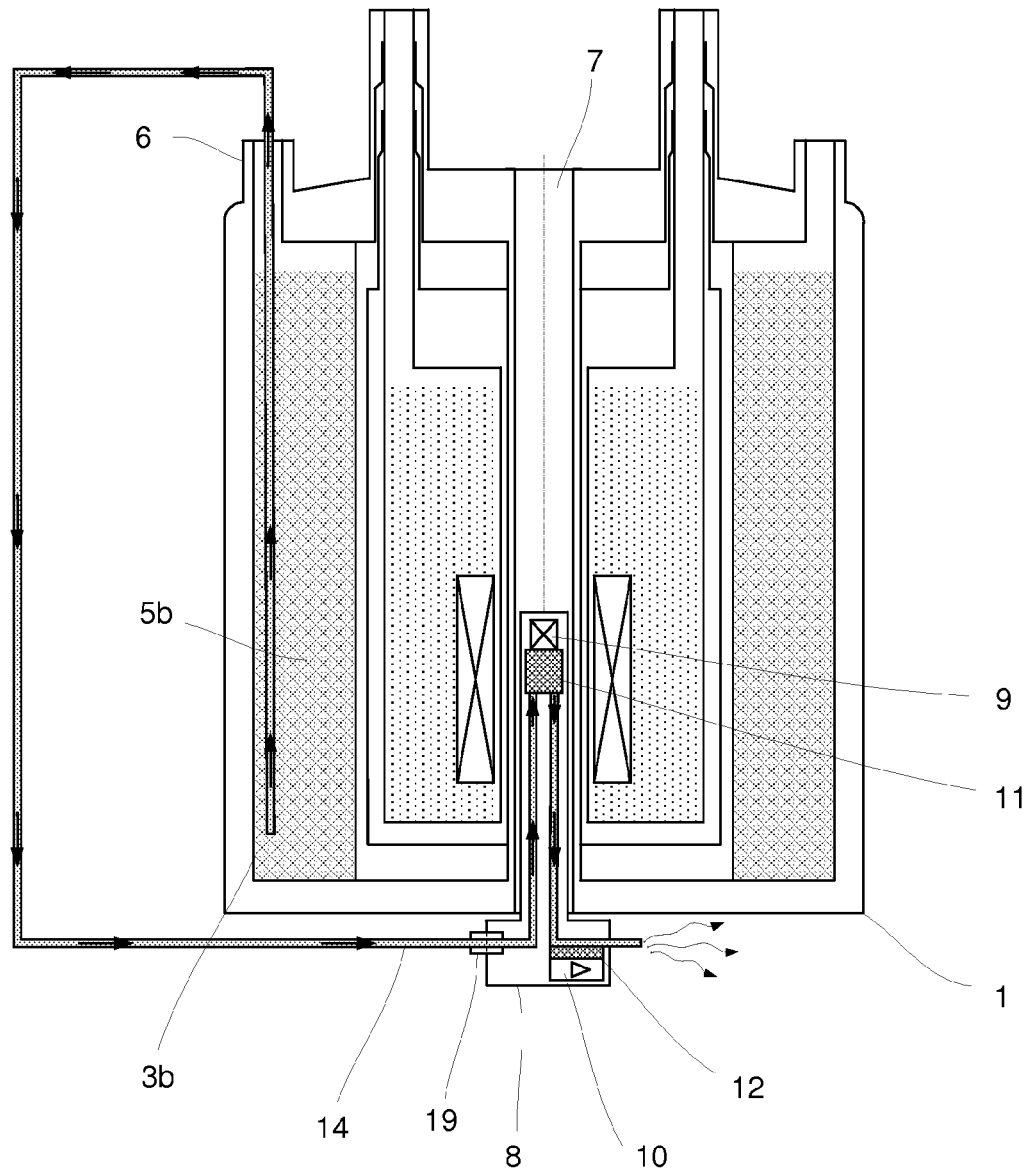
FIG. 1a shows an inventive device: nitrogen is removed from the nitrogen tank of the cryostat in a vertical arrangement.

For cooling the transmitting and receiving system in the probehead, consisting of RF part and preamplifier, nitrogen is removed from the nitrogen tank of the cryostat via a supply line.

The end of the supply line on the cryostat side is immersed into liquid nitrogen in the tank.

The end of the supply line on the probehead side is coupled to the probehead by means of a separable connection and is in continuous connection with the heat exchangers in the probehead for cooling the transmitting and receiving system.

The supply line, which is ideally vacuum-insulated, is installed on a nitrogen evaporation tower and thereby connected to the nitrogen tank of the cryostat.

The invention can be used both for cryostats with a horizontally and also vertically aligned room temperature bore.

Nitrogen is guided into the probehead, where it discharges heat, which is generated in the probehead through RF power and preamplifier electronics, via one or more heat exchanger(s). Cooling is effected through evaporation of liquid nitrogen in the heat exchangers. In an advantageous arrangement, the RF part and the preamplifier of the transmitting and receiving system are cooled by heat exchangers that are connected in series or in parallel. In a simple version, only the transmitting and receiving system may be cooled.

The supply of nitrogen may be effected by a pressure difference between the surroundings and the inner tank. An excess pressure may e.g. be generated due to the self-evaporation rate of the nitrogen container. This process may be supported by introducing additional nitrogen gas from a separate gas source.

It is also possible to generate the excess pressure by increasing the self-evaporation rate of the nitrogen container, e.g. in that a heating device that is immersed into nitrogen evaporates liquid nitrogen.

The supply may also be realized by a device, e.g. a pump that is immersed into liquid nitrogen, or a gas pump that is connected on the waste gas side, that may be located outside or inside of the probehead and supplies nitrogen through the probehead through suction. For supply through suction, a vacuum is generated by means of the gas pump, thereby supercooling the nitrogen in the heat exchangers and in the supply line. This reduces the evaporation temperature of the nitrogen and the temperature of the heat exchangers, thereby reducing the temperature in the probehead.

A pressure controller in connection with a pressure sensor regulates or controls the pressure difference between the nitrogen tank and the surroundings. A control device, e.g. an electronic control amplifier, may be used to control the pressure.

The liquid level in the nitrogen tank may be monitored by liquid level sensors.

Combinations with temperature sensors are also feasible, which monitor the temperature on the heat exchangers of the transmitting and receiving system in the probehead. Active temperature control would e.g. be possible with a control device and control heaters.

The flow rate of the nitrogen may be monitored with a flow sensor that may be positioned in the supply line or in the waste gas flow downstream of the probehead. A control device may be used to control a control element, such as e.g. a control valve or a variable throttle, to increase or reduce the flow rate. The control of the flow rate is mainly advantageous in combination with temperature sensors in the probehead.

The nitrogen may also be supplied through hydrostatic pressure. Towards this end, there must be a column of liquid nitrogen above the supply line. This type of supply is particularly effective when nitrogen is removed from the cryostat bottom. The inner tank of the cryostat may then be operated at any pressure. It may e.g. be permanently vented with respect to the surroundings or be adjusted to a constant pressure by a pressure controller.

Cooling may be effected through a moving medium (forced flow). A standing liquid column is also feasible (passive flow), where a flow forms through convection. Feasible would be a standing liquid column from the nitrogen tank to the heat exchangers in the probehead.

The combination with a cryo-cooling finger is very advantageous. A cryo-cooling finger generates a cold surface on which nitrogen gas can condense. In the closed system, waste gas is returned to the cryostat, is liquefied on the surface of a cold cooling finger, which has been cooled to a cryogenic temperature, and is returned to the nitrogen tank in liquid form. A combination of a cryo-cooling finger in an open cooling system is also possible. Nitrogen is thereby discharged from the probehead to the surroundings. A cryo-cooling finger obtains nitrogen directly from the air or through a separate gas supply, liquefies it and guides it into the nitrogen tank. Liquid nitrogen can therefore be continuously removed from the nitrogen tank for cooling, while the cryo-cooling finger is continuously refilling liquid nitrogen.

The nitrogen waste gas leaving the probehead may be returned coaxially to the supply line, thereby reducing the thermal losses of the supply line. The waste gas may also be supplied to a cryo-cooling finger through a separate line.

The nitrogen waste gas leaving the probehead may be supplied to the cryo-cooling finger by a gas pump. This gas pump may then be simultaneously used to suction the nitrogen through the probehead and the supply line out of the nitrogen tank. Pressure monitoring in the nitrogen container and components for throwing and expansion are then advantageous in such a cycle.

Continuous operation becomes possible in the closed or open system with cryo-cooling fingers, which must be interrupted only for maintenance work, if required.

Challenges in connection with the realization of embodiments:
  Optimum design of the heat exchangers when the space in the probehead is limited.
  Miniaturization of a supply device (pump) for liquid nitrogen for operation in a strong magnetic field.
  Vibration decoupling of cryo-cooling fingers and pumps from the cryostat. Vibration dampers are required for the connection between cryostat and cryo-cooling finger.

With respect to the challenges, it must be noted that the obstacles to be overcome are purely technical but are physically quite realistic.

FIG. 1a shows the inventive device. The nitrogen required for cooling the components of the transmitting and receiving system in the probehead 8 is removed from the nitrogen tank 3b of the cryostat 1 by means of a supply line 14 via a nitrogen evaporation tower 6. The supply line 14 is ideally vacuum-insulated with respect to the surroundings. The end of the supply line 14 on the cryostat side is immersed into the liquid nitrogen 5b inside the nitrogen tank 3b. The end of the supply line 14 on the probehead side is connected to the probehead 8 via a separable connection 19 and guides nitrogen to the heat exchangers 11 and 12 of the RF part 9 and of the preamplifier 10.

Figure 1B:
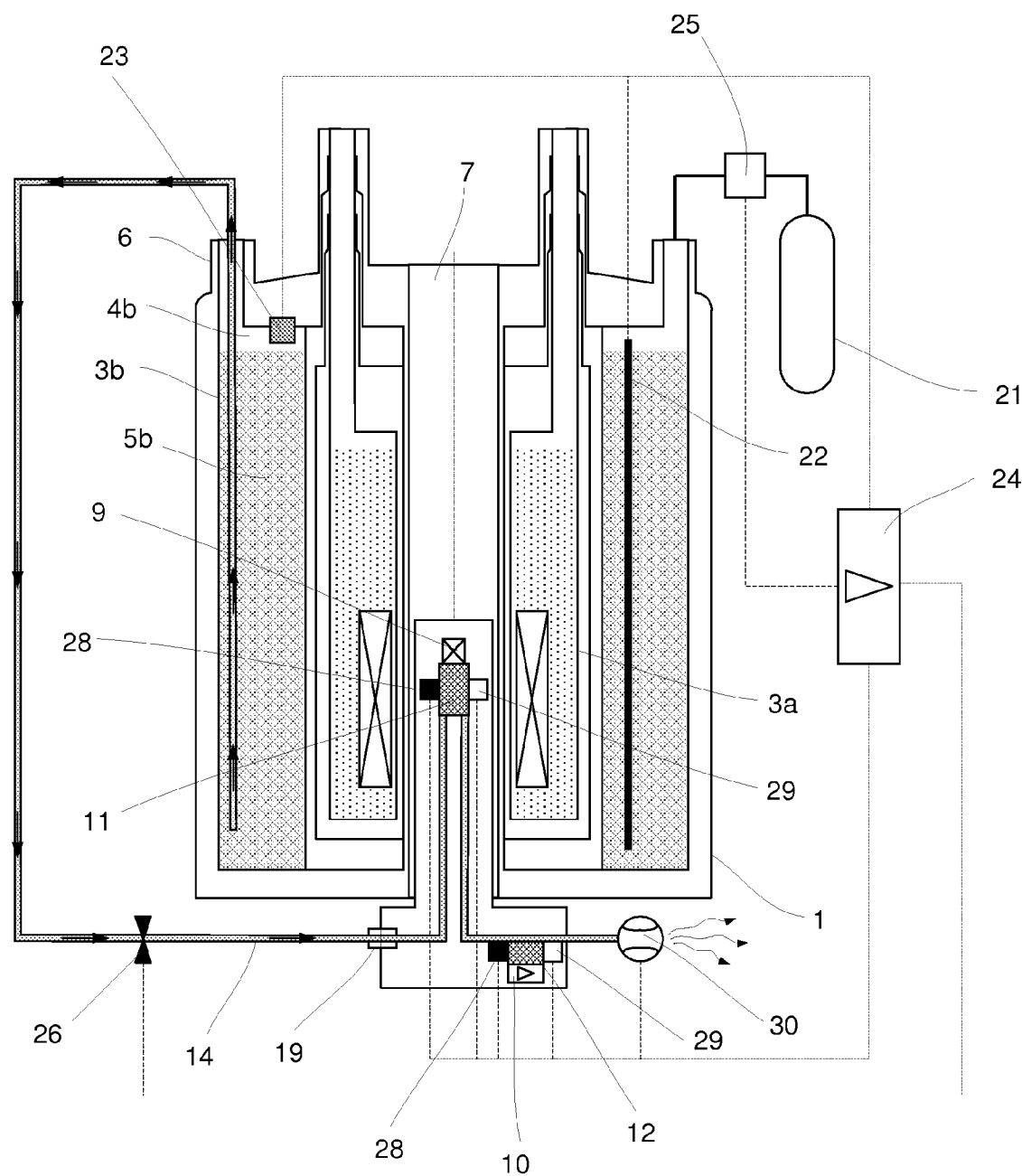
FIG. 1b shows an inventive device in accordance with FIG. 1a, with sensors and actuators for control and monitoring.

FIG. 1b shows the inventive device according to FIG. 1a, supplemented by control and monitoring components. Liquid nitrogen 5b is supplied to the heat exchangers 11 and 12 by pressurizing the gas compartment 4b of the nitrogen tank 3b to a pressure that is higher than the ambient pressure. The pressure in the nitrogen tank 3b is measured by a pressure sensor 23 whose signal is passed on to a control device 24, e.g. an electronic control amplifier. The control device 24 itself controls a pressure controller 25, which is connected to a gas supply 21. The pressure controller 25 conveys gas from the gas supply 21 into the nitrogen tank 3b or relieves pressure from the nitrogen tank 3b to the surroundings when e.g. the self-evaporation rate of the nitrogen tank 3b is sufficient in order to maintain the required supply pressure. A liquid level sensor 22 is used to monitor the liquid level in the nitrogen tank 3b. When a certain liquid level has been fallen below in the nitrogen tank 3b, the pressure can be reduced by the pressure controller 25 in such a fashion that the supply of liquid nitrogen is stopped and thermal shielding of the helium tank 3a remains ensured. The flow volume of nitrogen, which is supplied to the probehead 8 via the supply line 14, can be adjusted by a control element 26, e.g. a control valve or a variable throttle. A flow sensor 30 disposed on the waste gas side can also be used to monitor the delivery volume. The respective temperature can be measured using temperature sensors 28 and control heaters 29 on the heat exchangers 11 and 12 within the probehead 8, and when a certain value has been fallen below, the temperature can be corrected by means of the control heater 29. Further control and monitoring components can be combined in various configurations and be applied to all described variants.

Figure 2:
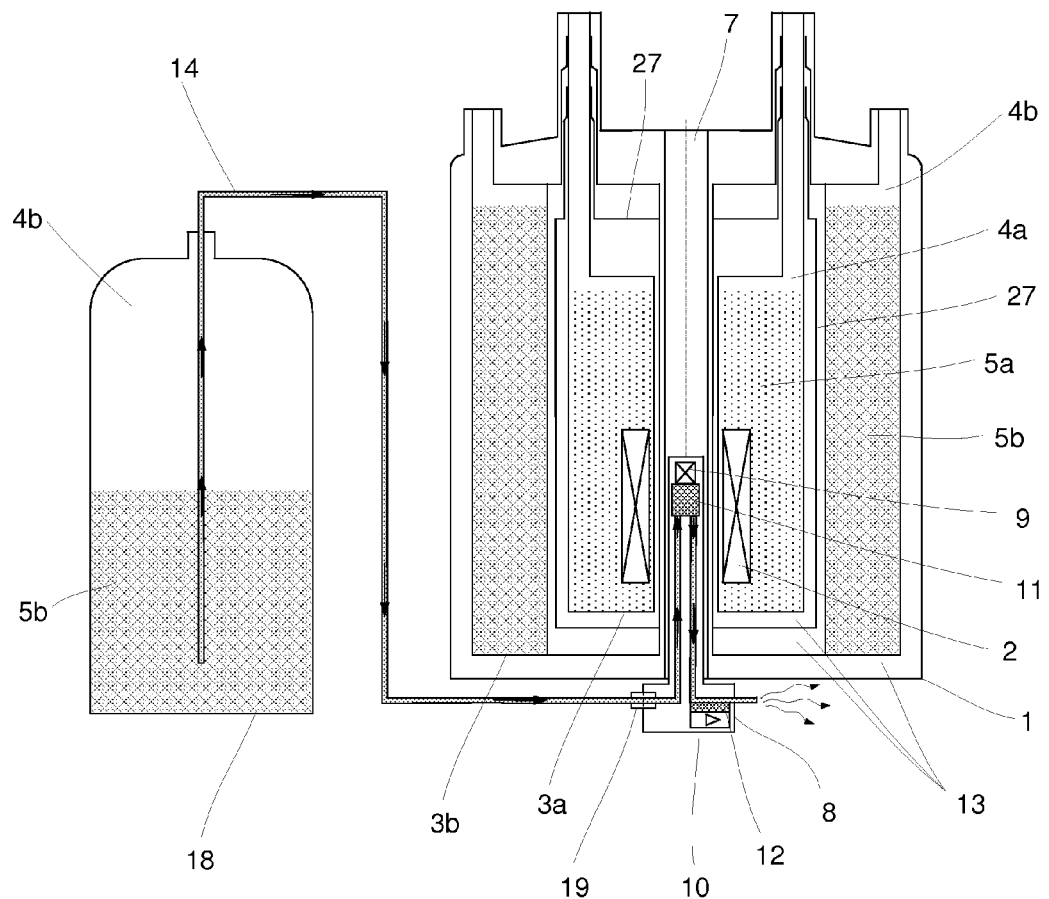
FIG. 2 shows prior art: cryostat with inserted probehead and external nitrogen tank for cooling the probehead.

FIG. 2 shows prior art.

Figure 3:
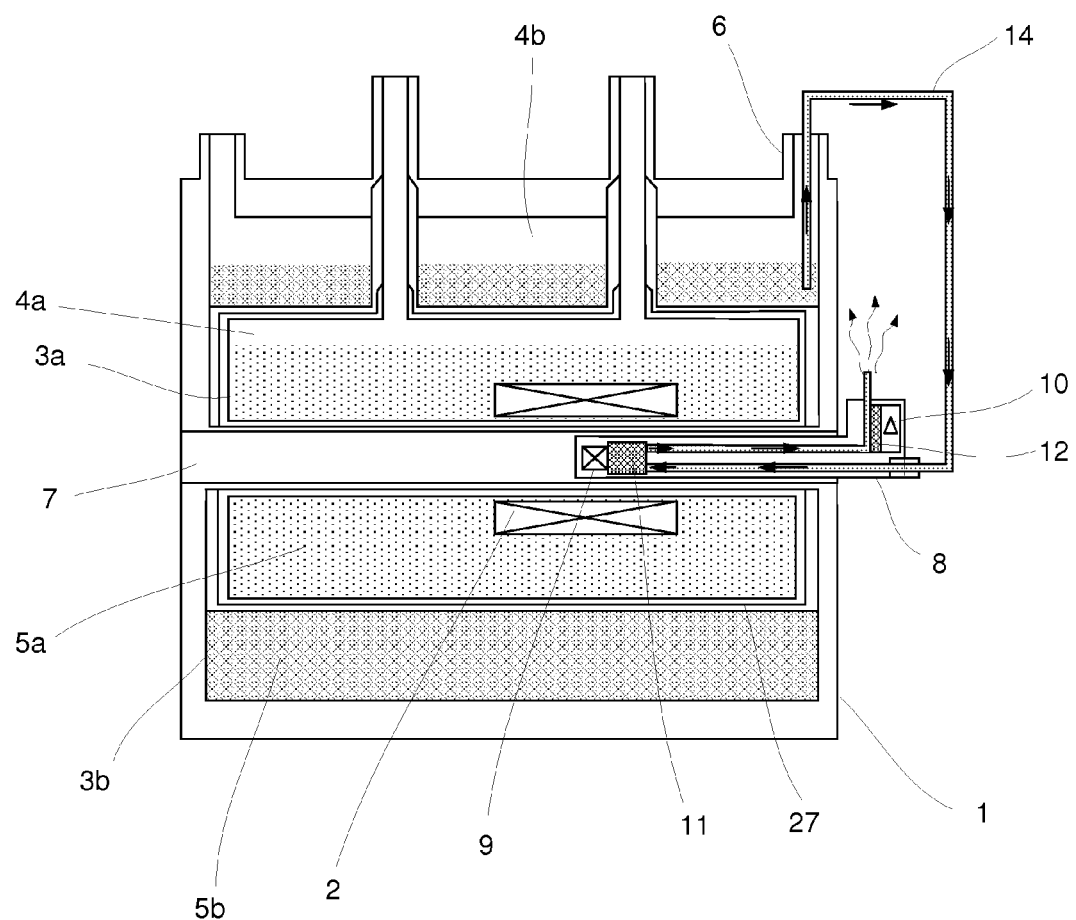
FIG. 3 shows an inventive device, nitrogen is removed from the nitrogen tank of the cryostat in a horizontal arrangement.

FIG. 3 shows the inventive device analogous to FIG. 1a on a cryostat 1 with horizontally disposed room temperature bore 7. Horizontal room temperature bores are typically found in MRI apparatus, whereas vertical room temperature bores are typically found in NMR apparatus.

Figure 4:
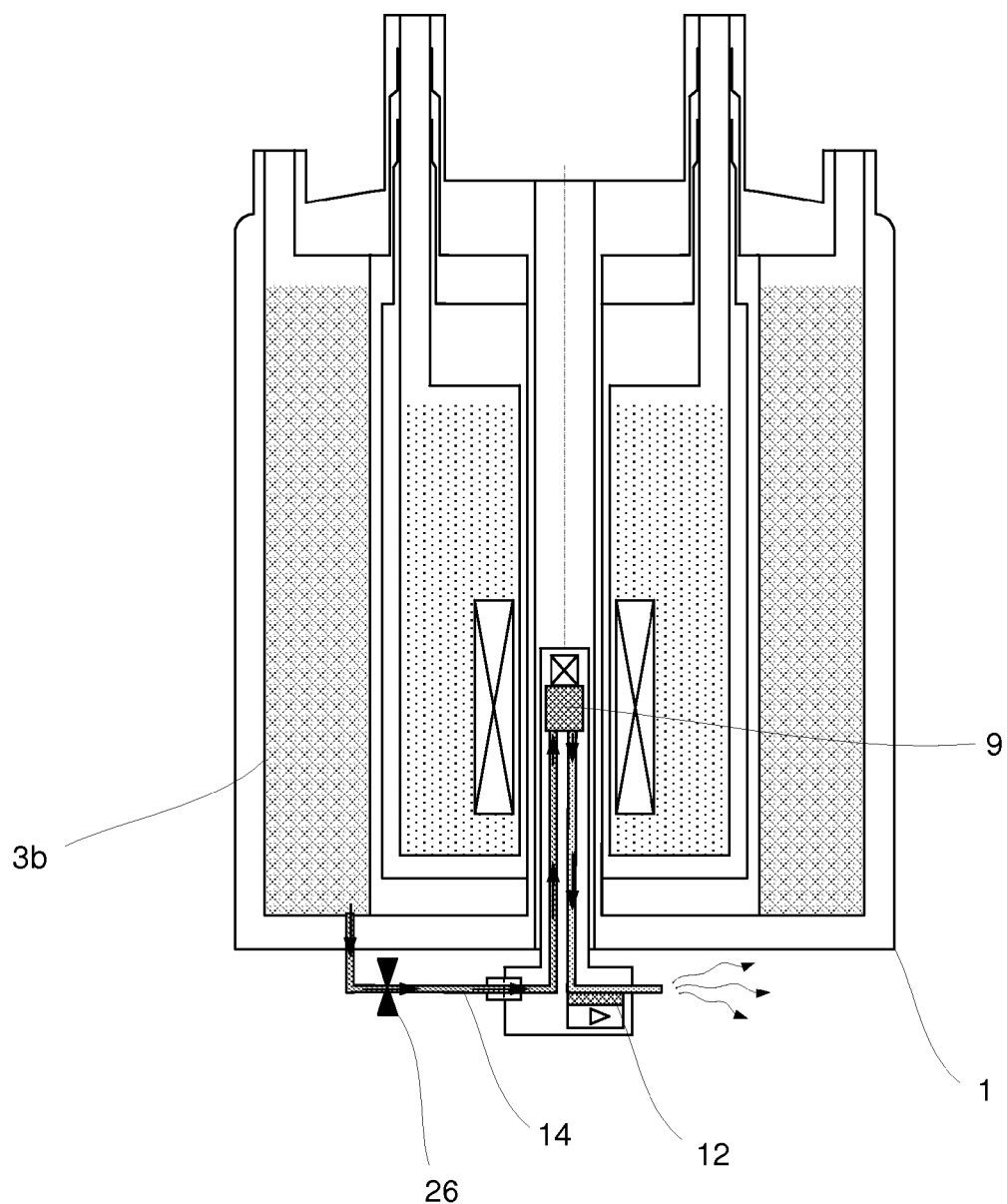
FIG. 4 shows an inventive device, wherein the supply line for removing nitrogen is coupled from below to the nitrogen tank of the cryostat and is provided with a control element and a liquid level sensor.

FIG. 4 shows the inventive device, wherein the supply line 14 for removing nitrogen is coupled from below to the cryostat 1 and the nitrogen tank 3b. This embodiment does not require a supply device nor pressurization of the nitrogen tank 3b to effect supply, since the hydrostatic pressure due to the liquid nitrogen 5b in the nitrogen container 3b is sufficient for supplying nitrogen to the heat exchangers 11 and 12 for cooling the transmitting and receiving system. A control element 26, e.g. a control valve or a variable throttle, may be opened or closed in order to vary the nitrogen delivery volume.

Figure 5:
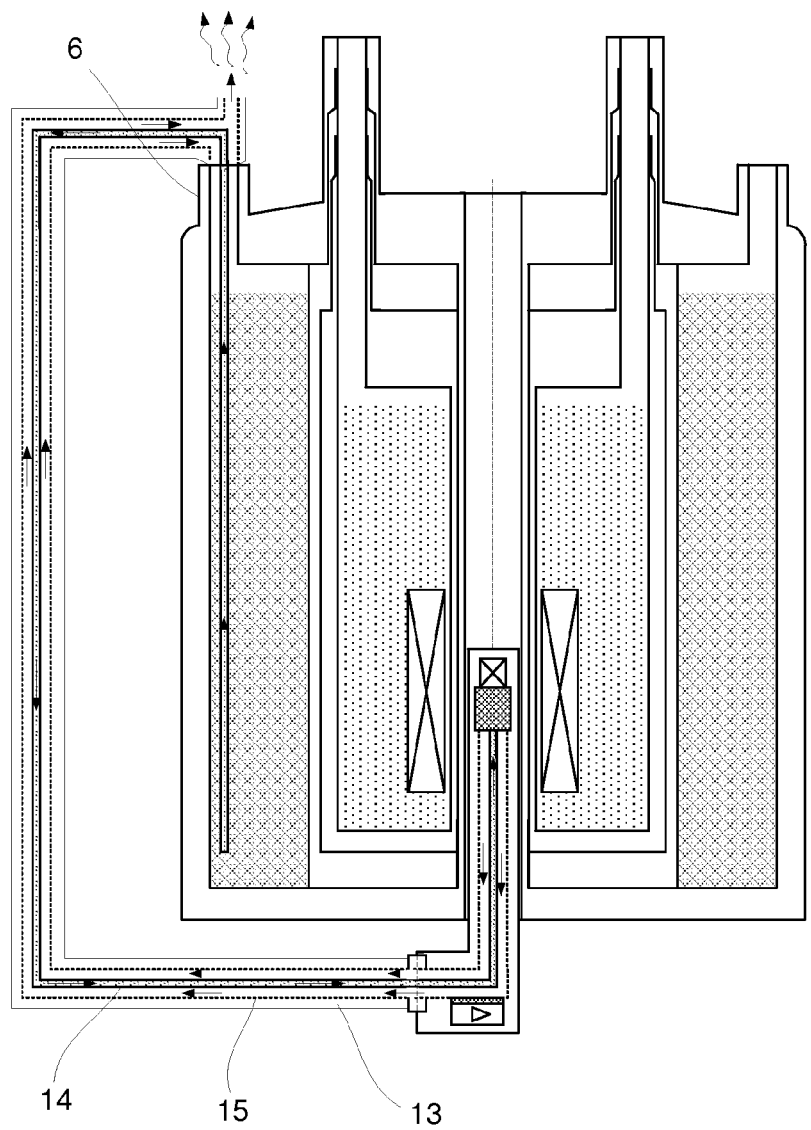
FIG. 5 shows an inventive device with coaxial return of the waste gas for thermally shielding the supply line.

FIG. 5 shows the inventive device analogous to FIG. 1a, wherein the nitrogen that flows out of the probehead 8 is channeled by a waste gas line 15 and is returned in a coaxial direction to the supply line 14 up to the evaporation tower 6, where and not before it is discharged to the surroundings. This reduces the thermal loss of the supply line 14. The supply line 14 and the coaxial waste gas line 15 are ideally insulated from the surroundings by a vacuum chamber 13.

Figure 6:
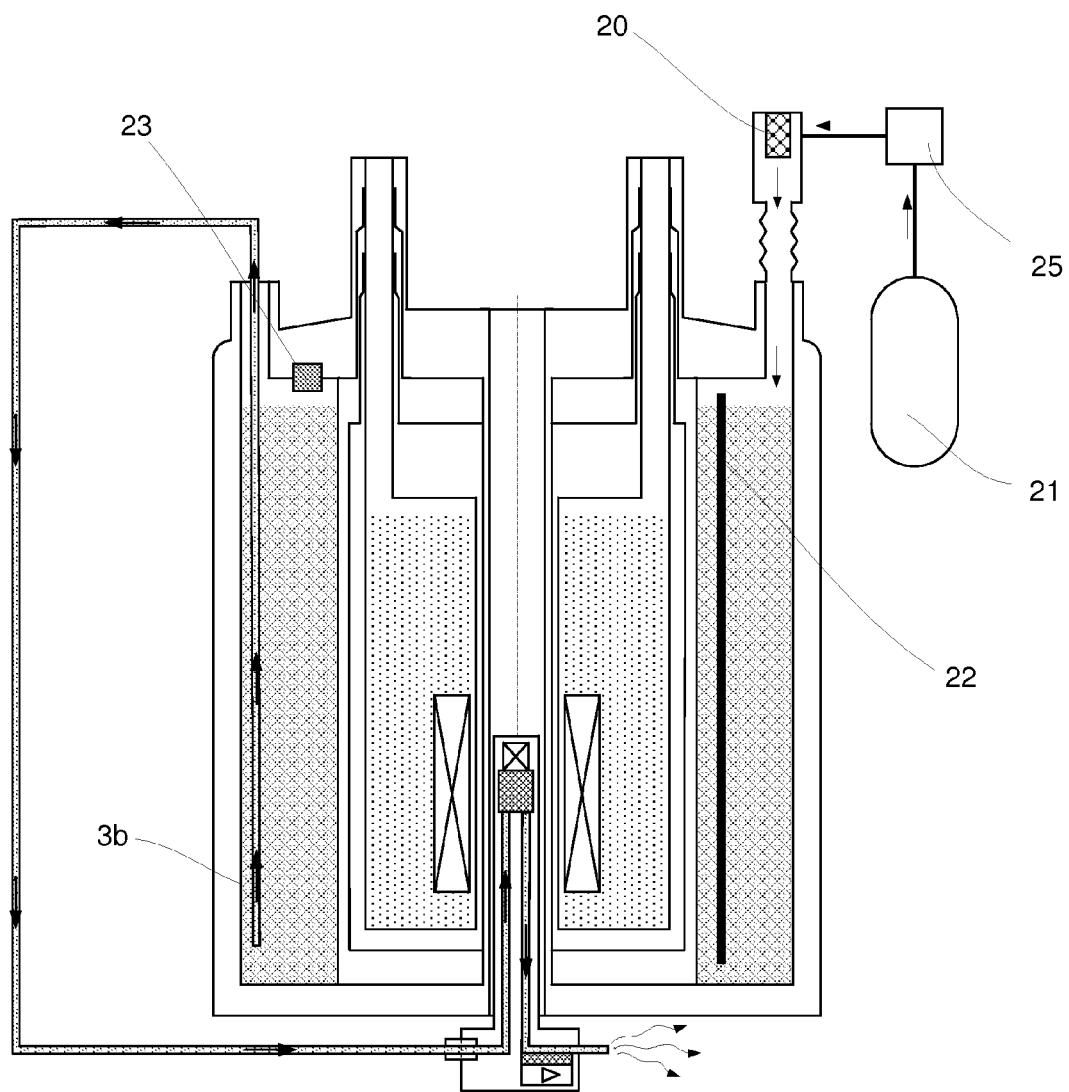
FIG. 6 shows an inventive device with cryo-cooling fingers on the nitrogen evaporation tower of the cryostat and a liquid level sensor in the nitrogen tank.

FIG. 6 shows the inventive device analogous to FIG. 1a, supplemented by a cryo-cooling finger 20. Nitrogen gas is supplied to the cryo-cooling finger 20 via a gas supply 21, the nitrogen gas is then liquefied by the cryo-cooling finger 20 and is guided in liquid form into the nitrogen chamber 3b. The gas supply 21 may be realized e.g. in the form of a gas bottle or separation of nitrogen from the air.

The liquefied amount of nitrogen and therefore the level in the nitrogen tank 3b are controlled by the supplied nitrogen gas amount via the external pressure supply 21 and the pressure controller 25. A pressure sensor 23 and a liquid level sensor 22 may e.g. be used for control and monitoring.

The advantage of the arrangement illustrated in FIG. 6 is the continuous operation of the nuclear magnetic resonance apparatus, since refilling of the nitrogen tank 3b is not required. The level that falls due to permanent removal of nitrogen is continuously increased again by the cryo-cooling finger 20, thereby obtaining a liquid nitrogen level that is almost constant with time.

Figure 7:
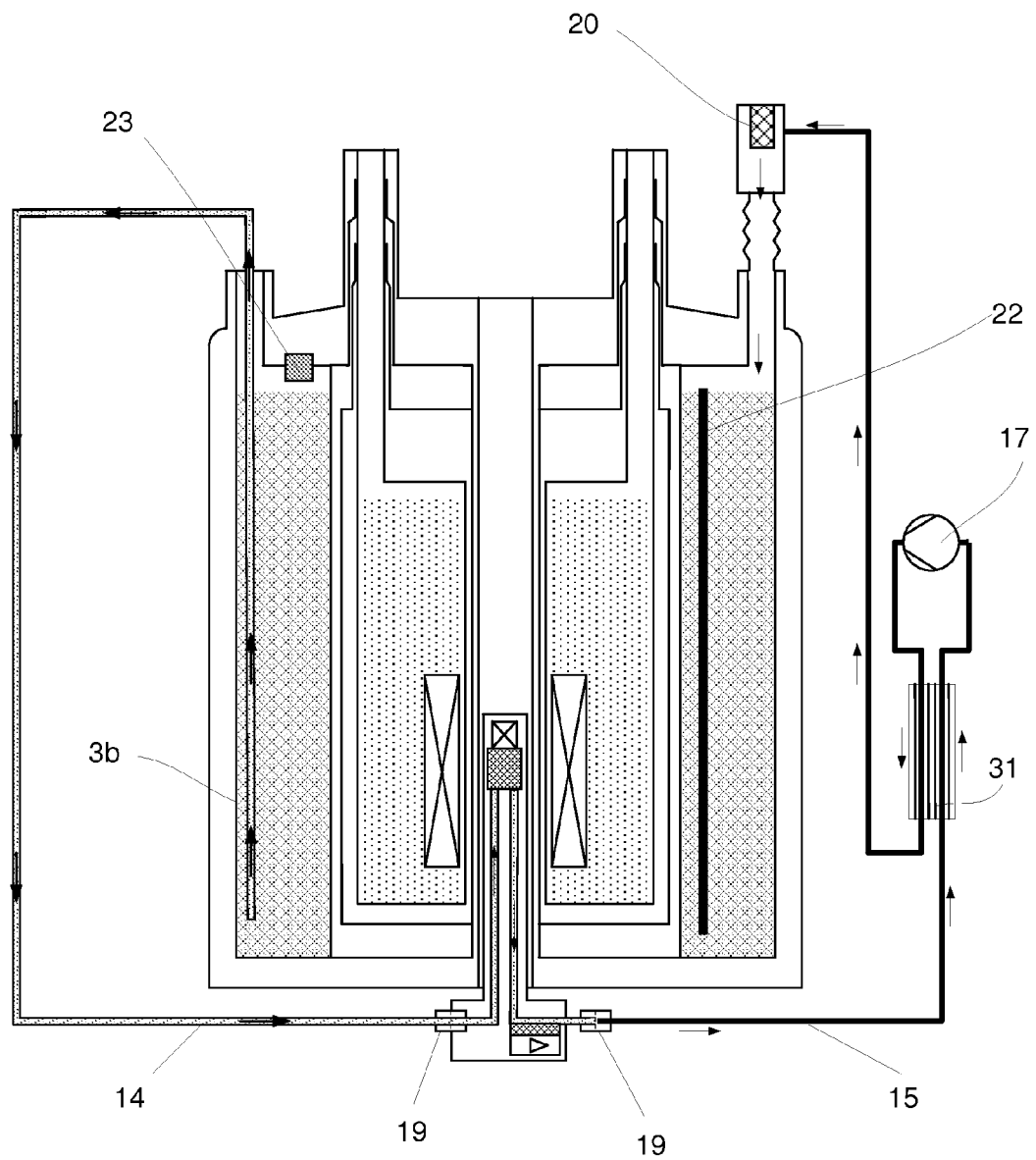
FIG. 7 shows an inventive device, in which the waste gas is returned to the cryo-cooling finger through a circulation pump.

FIG. 7 shows the inventive device analogous to FIG. 6 in a closed nitrogen cycle. The nitrogen leaving the probehead 8 is supplied to a cryo-cooling finger 20 through a waste gas line 15 by means of a gas pump 17. The gas pump 17 may also be used to create the pressure difference between the nitrogen tank 3b and the probehead 8, which is required for supplying nitrogen. For recooling, the nitrogen gas, which is compressed by the circulating pump 17, is guided through a heat exchanger 31.

Figure 8:
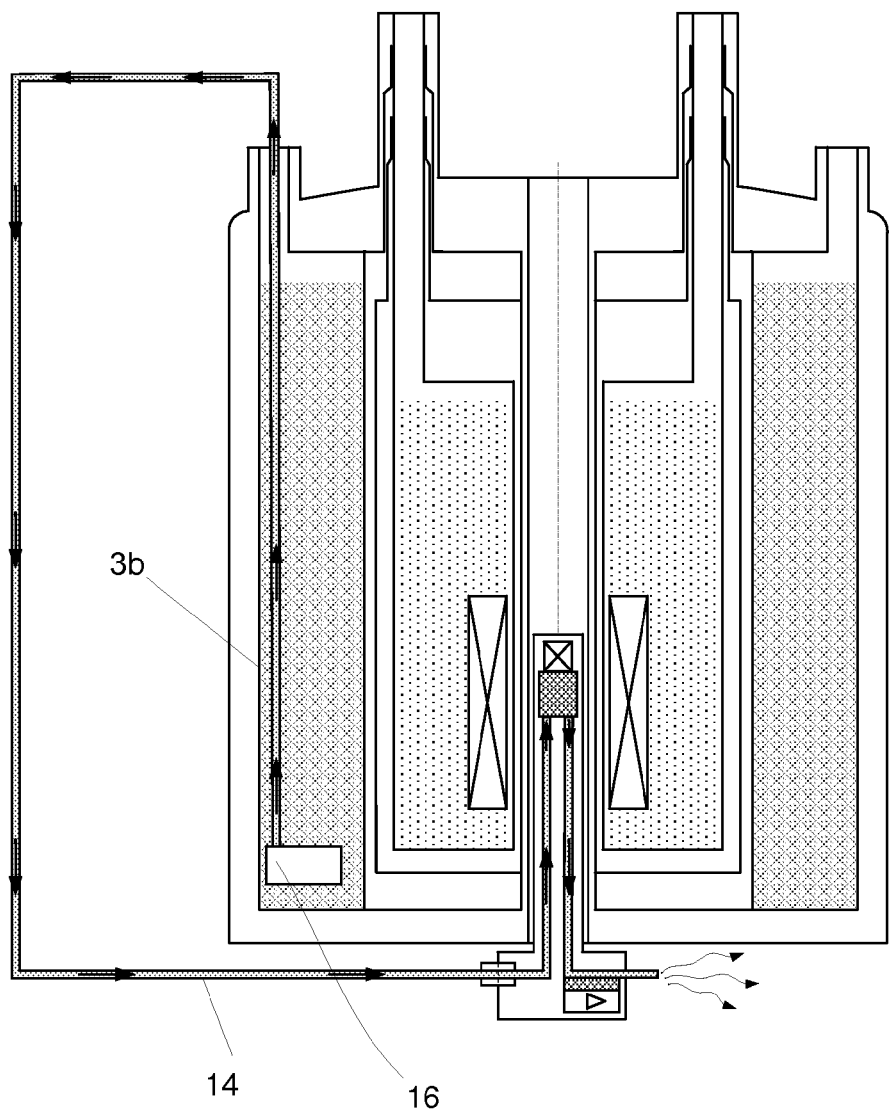
FIG. 8 shows an inventive device with a device for supplying nitrogen inside the nitrogen tank.

FIG. 8 shows the inventive device, wherein a device for supplying liquid nitrogen 16 is disposed inside the nitrogen tank 3b by way of example. The position of the device for supplying liquid nitrogen 16 may, however, be selected at any point along the supply line 14. The device for supplying liquid nitrogen 16 supplies liquid nitrogen through the supply line 14 to the probehead 8 and the heat exchangers 10 and 12. The device for supplying liquid nitrogen 16 may e.g. be designed in the form of a pump, which can moreover be combined with control and monitoring components described in FIG. 1b.

Figure 9:
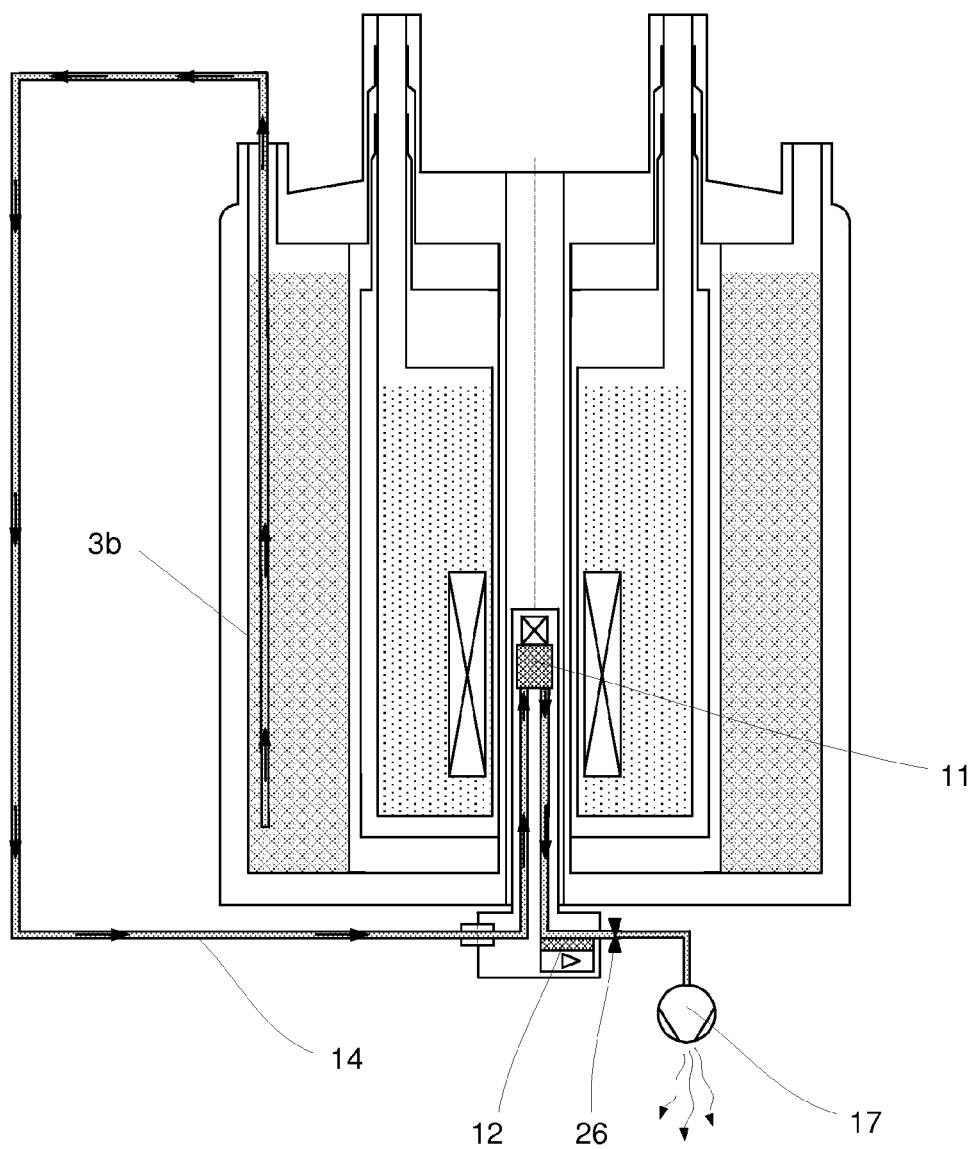
FIG. 9 shows an inventive device with a gas pump, which is connected to the probehead, for supplying nitrogen through suction.

FIG. 9 shows the inventive device similar to FIG. 8, wherein a gas pump 17 is located outside of the cryostat 1, which supplies, through suction, nitrogen from the nitrogen tank 3b through the supply line 14 to the probehead 8. The great advantage of this variant is subcooling of the nitrogen in the probehead, since the evaporation temperature of nitrogen decreases when the pressure is reduced. This also reduces the lowest achievable temperature. A control element 26 on the waste gas side could e.g. be used to adjust the optimum delivery volume. Further combinations with the control and monitoring components described in FIG. 1b are also possible.

LIST OF REFERENCES

[1] U.S. Pat. No. 5,247,256, RF receiver coil arrangement for NMR spectrometers, Bruker Biospin, Marek, 1993
[2] AT 405 322 B, 1992, Vorrichtung zum kontinuierlichen Nachfüllen von Flüssigstickstoff in Kühlkammern (Device for continuous refilling of liquid nitrogen into cooling chambers), Sitte Helmuth
[3] Komori M., and Uchino K., 2004, Development of a Liquid Nitrogen Pump Using Superconducting Bulk Motor, IEE Transactions on Applied Superconductivity., Vol. 14, Issue 2, p. 1659-1662
[4] Haruyama T. and Yoshizaki R., 1986, A miniature centrifugal pump for an automatic liquid nitrogen filling system., Journal of Physics E: Scientific Instruments, Vol. 19, p. 919-921
[5] U.S. Pat. No. 5,966,944, Superconducting magnet system outfitted with cooling apparatus, Aisin Seiki Kabushiki Kaisha, 1999
[6] DE 43 02 038 A1, 1993, Vorrichtung für die Herstellung von flüssigem Stickstoff (Device for the production of liquid nitrogen), Iwatani Plantech Corp., Yanai et al.

LIST OF REFERENCE NUMERALS

1 Cryostat
2 magnet coil system
3a, 3b inner tanks with helium (a) and nitrogen (b)
4a, 4b cryogenic gas, helium (a) and nitrogen (b)
5a, 5b cryogenic liquid, helium (a) and nitrogen (b)
6 nitrogen evaporation tower
7 room temperature bore
8 NMR probehead
9 RF part of the transmitting and receiving system
10 preamplifier of the transmitting and receiving system
11 heat exchanger for cooling the RF part of the transmitting and receiving system
12 heat exchanger for cooling the preamplifier of the transmitting and receiving system
13 vacuum insulation
14 supply line
15 waste gas line
16 device for supplying liquid nitrogen
17 gas pump
18 external nitrogen tank
19 separable connection
20 cryo-cooling finger
21 gas supply
22 liquid level sensor
23 pressure sensor
24 control device
25 pressure controller
26 control element
27 cold shield
28 temperature sensor
29 control heater
30 flow sensor
31 heat exchanger

We claim:

1. An NMR (nuclear magnetic resonance) apparatus, the apparatus comprising:
a cryostat having at least one nitrogen tank for receiving liquid nitrogen, said cryostat defining a room temperature bore;
a magnet system disposed in said cryostat;
an NMR probehead disposed in said room temperature bore, said NMR probehead having a transmitting and receiving system; and
a supply line, said supply line disposed between and connecting said nitrogen tank of said cryostat to said NMR probehead, said supply line disposed, structured and dimensioned to remove liquid nitrogen from said nitrogen tank and to guide that removed liquid nitrogen to said NMR probehead, thereby cooling said NMR probehead or parts of said NMR probehead to cryogenic temperatures, said supply line thereby having a first end disposed, structured and dimensioned for immersion into liquid nitrogen within said nitrogen tank and a second end connected to said NMR probehead, wherein said supply line has a supply line section extending outside of said cryostat between said first end and said second end.

2. The NMR apparatus of claim 1, wherein said supply line projects through a nitrogen evaporation tower into said nitrogen tank of said cryostat.

3. The NMR apparatus of claim 1, wherein said cryostat has a removal device by means of which liquid nitrogen can be removed due to a hydrostatic pressure in said nitrogen tank of said cryostat.

4. The NMR apparatus of claim 1, wherein supply of nitrogen into said supply line is realized by a pressure in a gas compartment of said nitrogen tank, which is larger than ambient pressure.

5. The NMR apparatus of claim 1, further comprising a device for supplying liquid nitrogen into said supply line said device arranged inside said nitrogen tank of said cryostat.

6. The NMR apparatus of claim 1, wherein a device for supplying liquid nitrogen into said supply line utilizes suction and is connected to a gas outlet of said NMR probehead.

7. The NMR apparatus of claim 1, wherein a waste gas line is provided in a coaxial direction to said supply line for transporting nitrogen leaving said NMR probehead.

8. The NMR apparatus of claim 1, wherein said supply line has at least one separable or coupling connection.

9. The NMR apparatus of claim 7, wherein said waste gas line for transporting nitrogen leaving said NMR probehead has at least one separable or coupling connection.

10. The NMR apparatus of claim 1, wherein a pressure sensor is provided in a chamber that is connected to said nitrogen tank of said cryostat.

11. The NMR apparatus of claim 1, wherein a liquid level sensor is disposed in said nitrogen tank of said cryostat.

12. The NMR apparatus of claim 1, wherein a cryo-cooling finger projects into a chamber that is connected to said nitrogen tank of said cryostat.

13. The NMR apparatus of claim 12, wherein said chamber containing said cryo-cooling finger is connected to an external gas supply.

14. The NMR apparatus of claim 1, wherein a waste gas line is provided for returning nitrogen gas leaving said NMR probehead into a chamber that is connected to said nitrogen tank of said cryostat.

15. The NMR apparatus of claim 14, wherein a gas pump is provided for supplying nitrogen gas leaving said NMR probehead into said chamber that is connected to said nitrogen tank of said cryostat.

16. The NMR apparatus of claim 15, wherein a heat exchanger is disposed around at least one section of said waste gas line.

* * * * *